United States Patent
Hu et al.

(10) Patent No.: US 6,787,470 B2
(45) Date of Patent: Sep. 7, 2004

(54) SACRIFICIAL FEATURE FOR CORROSION PREVENTION DURING CMP

(75) Inventors: Chu-Wei Hu, Taichung (TW); Tsu Shih, Hsin-Chu (TW); Chen Cheng Chou, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/150,300

(22) Filed: May 17, 2002

(65) Prior Publication Data

US 2003/0216047 A1 Nov. 20, 2003

(51) Int. Cl.⁷ .................. H01L 21/302; H01L 23/48
(52) U.S. Cl. .................. 438/691; 438/692; 438/690; 438/687; 438/622; 438/959; 257/758; 257/784; 257/786; 257/81; 257/82
(58) Field of Search .................. 438/691, 692, 438/690, 618, 677, 687, 622, 625, 959, 542; 257/53, 81, 82, 758, 784, 786, 762, 781, 750

(56) References Cited

U.S. PATENT DOCUMENTS 6,376,345 B1 * 4/2002 Ohashi et al. .............. 438/542
6,515,366 B1 * 2/2003 Chiou et al. ................ 257/758
2002/0079517 A1 * 6/2002 Kim ........................... 257/207

* cited by examiner

*Primary Examiner*—Matthew Smith
*Assistant Examiner*—Igwe U. Anya
(74) *Attorney, Agent, or Firm*—Tung & Associates

(57) ABSTRACT

A sacrificial semiconductor feature for preventing corrosion that can result during chemical-mechanical planarization (CMP) is disclosed. A semiconductor device of the invention is fabricated at least in part by performing CMP. The device includes a desired semiconductor feature and a sacrificial semiconductor feature. The desired semiconductor feature may have an unbalanced geometric pattern that includes a metallic line ending in at least one tip. The at least one tip is susceptible to corrosion resulting from performing CMP. The sacrificial semiconductor feature is preferably located off the metallic line of the desired semiconductor feature. The sacrificial semiconductor feature attracts charge induced during CMP that is otherwise attracted by the at least one tip of the desired semiconductor feature. The presence of the sacrificial semiconductor feature thus substantially prevents corrosion of the desired semiconductor feature, including its tip(s).

17 Claims, 4 Drawing Sheets

SACRIFICIAL FEATURE FOR CORROSION PREVENTION DURING CMP

FIELD OF THE INVENTION

This invention relates generally to chemical-mechanical polishing (CMP), and more particularly to the corrosion that can result from using CMP.

BACKGROUND OF THE INVENTION

Chemical mechanical polishing (CMP) is a semiconductor wafer flattening and polishing process that combines chemical removal with mechanical buffing. It is used for polishing and flattening wafers after crystal growing, and for wafer planarization during the wafer fabrication process. CMP is a favored process because it can achieve global planarization across the entire wafer surface, can polish and remove all materials from the wafer, can work on multi-material surfaces, avoids the use of hazardous gasses, and is usually a low-cost process.

Via holes, or more simply "vias," are semiconductor device features that are through holes made in a substrate, for a variety of different purposes. Via holes may be used to ground semiconductor devices and passive devices. Via holes may be made through dielectric layers, for subsequent metal deposition to form a plug and create an interconnect between two metal lines. Multi-level interconnect schemes may employ such via holes. Processes used to perform such interconnection using via holes include the damascene process and the dual-damascene process.

In the damascene process, interconnect metal lines are delineated in dielectrics, isolating them from each other using CMP in lieu of lithography and etching. The interconnect pattern is first lithographically defined in the dielectric layer, and then metal is deposited to fill the resulting trenches. Excess metal is removed by CMP. The dual-damascene process is a modified version of the damascene process, and is also used to form metal interconnect geometries using CMP instead of metal etching. In the dual-damascene process, two inter-layer dielectric patterning steps and one CMP step creates the pattern that would require two patterning steps and two metal CMP steps if the conventional damascene process were instead used.

Thus, the fundamental difference of damascene processing relative to standard processing is that metal lines are not etched, but deposited in grooves within the dielectric layer, and excess metal is removed by CMP. Both damascene process are considered the future technology of choice for laying metal lines and interconnects on semiconductor devices. The damascene process is commonplace for 0.18–0.13 micron technology, whereas the dual-damascene process is more common for 0.13–0.10 micron technology.

A problem with the CMP as performed in damascene and other processes is that corrosion can result, particularly at the ends of copper interconnects. More specifically, some semiconductor layouts are more vulnerable to such corrosion. These layouts may have one or more of the following characteristics. First, the end of an interconnect has a small geometric tip. Second, the interconnect has an unbalanced geometric pattern, including a long metallic line with sufficient resistance. An unbalanced geometric pattern can be generally defined herein as including a long line with one or more tips extending therefrom. The charge induced during CMP gathers at the tip of the end of the long metallic line. This results in a strong electric field at the line tip, causing a chemical-electrical reaction at the tip. The chemical-electrical reaction results from the CMP solution and the interconnect itself. Ends of the unbalanced interconnect act as the anode and cathode for this reaction.

FIG. 1 shows an example of a semiconductor layout 100 that is susceptible to copper interconnect corrosion resulting from performing CMP. The layout 100 includes a number of metal lines, such as the metal line 102, as well as a number of unused, or "dummy," metal lines, such as the metal line 104. The probe pad 106 has a metal interconnect 108 extending therefrom. The metal interconnect 108, which may be a copper interconnect, itself has two tips 110 extending therefrom. These tips 110 may be vias, or another semiconductor feature. During CMP, these tips 110 are susceptible to corrosion, for the reasons described in the preceding paragraph.

Whereas FIG. 1 is a top view of the semiconductor layout 100, FIG. 2 shows a partial side view of the semiconductor layout 100, including a dielectric 202. The tips 110 are shown as vias, extending to the metal interconnect 108. Again, the tips 110 may be corroded during CMP.

FIG. 3 shows another view of a semiconductor layout 300 that is susceptible to copper interconnect corrosion resulting from performing CMP. FIG. 3 specifically shows a top view of the layout 300, where there is a large metallic pad 302, from which a metallic line or interconnect 306 extends and ends at a small stacked via and metal island 304. The metallic line or interconnect 306 has sufficient resistance, as indicated by the springed line 308, that corrosion of the small stacked via and metal island 304 results.

Therefore, there is a need for preventing corrosion during CMP. Such corrosion should specifically be prevented for features that are particularly susceptible to corrosion. These features at least include unbalanced interconnect layouts as have been shown and described. For these and other reasons, there is a need for the present invention.

SUMMARY OF THE INVENTION

The invention relates to a sacrificial semiconductor feature for preventing corrosion that can result during chemical-mechanical planarization (CMP). A semiconductor device of the invention is fabricated at least in part by performing CMP. The device includes a desired semiconductor feature and a sacrificial semiconductor feature. The desired semiconductor feature may have an unbalanced geometric pattern that includes a metallic line ending in at least one tip. The at least one tip is susceptible to corrosion resulting from performing CMP. The sacrificial semiconductor feature is preferably located off the metallic line of the desired semiconductor feature. The sacrificial semiconductor feature attracts charge induced during CMP that is otherwise attracted by the at least one tip of the desired semiconductor feature. The presence of the sacrificial semiconductor feature thus substantially prevents corrosion of the desired semiconductor feature, including its tip(s).

Embodiments of the invention provide for advantages over the prior art. As has been indicated, the presence of the sacrificial semiconductor feature prevents corrosion of the desired semiconductor feature. Thus, the sacrificial semiconductor feature is itself sacrificed by being corroded, so that the desired semiconductor feature is not corroded. Charge that would otherwise be induced at the desired semiconductor feature is instead induced at the sacrificial semiconductor feature, sparing the desired semiconductor feature from corrosion. The sacrificial semiconductor feature may be antenna-shaped or needle shaped tips, and there may be more than one sacrificial semiconductor feature and more than one desired semiconductor feature. The sacrificial semiconductor feature may include one or more vias that may or may not have corresponding metal islands therein. Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
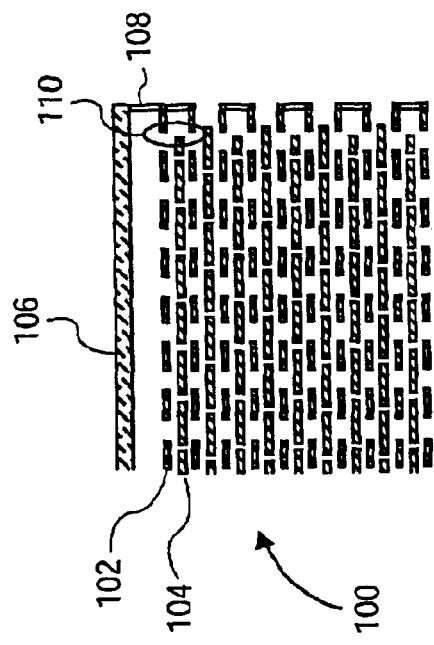
FIG. 1 is a diagram of a top view of a semiconductor layout that includes an unbalanced interconnect feature which is particularly susceptible to corrosion during performance of chemical-mechanical planarization (CMP).
Figure 2:
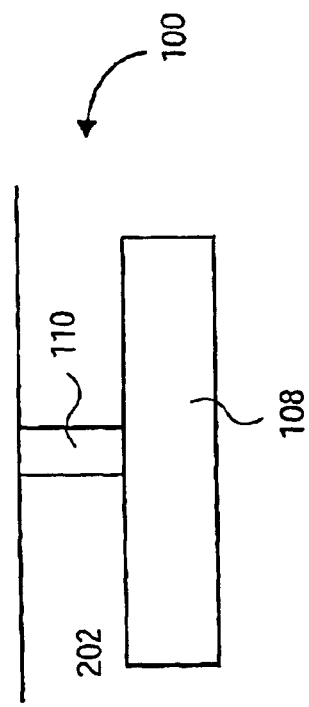
FIG. 2 is a diagram of a partial side view of the semiconductor layout of FIG. 1 that includes an interconnect particularly susceptible to corrosion during performance of CMP.
Figure 3:
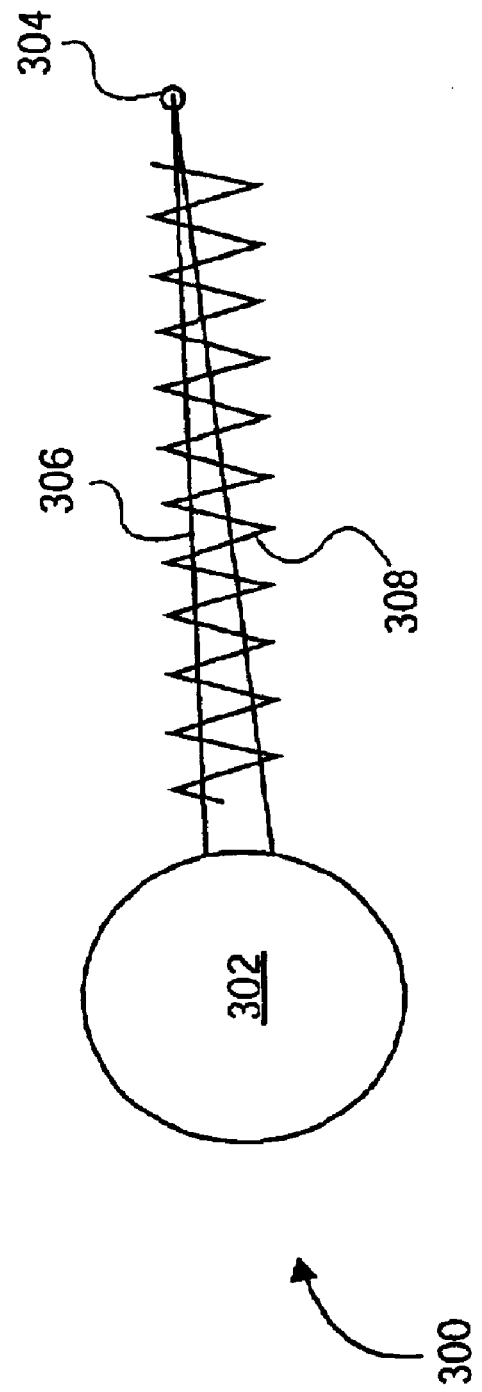
FIG. 3 is a diagram of a top view of a semiconductor layout that includes a metallic line or interconnect ending in a small stacked via and metal island feature that is particularly susceptible to corrosion during performance of CMP, at least in part because of the sufficiently high resistance of the line or interconnect.
Figure 4:
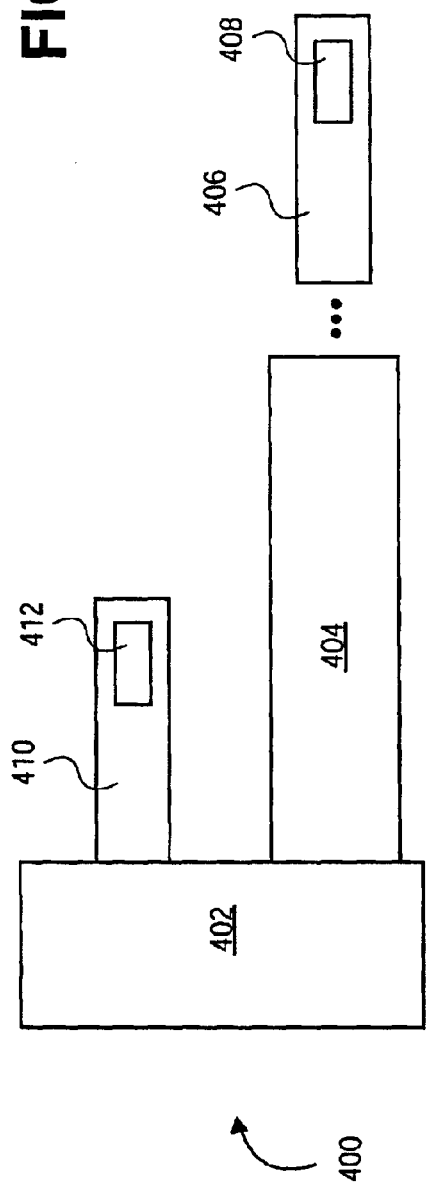
FIG. 4 is a diagram of a semiconductor layout that includes an unbalanced interconnect feature, as well as a sacrificial "antenna" semiconductor feature that becomes corroded during performance of CMP to prevent corrosion of the unbalanced interconnect feature, according to an embodiment of the invention.

FIG. 4 shows a semiconductor layout 400 according to an embodiment of the invention. The semiconductor layout 400 may be used to fabricate a semiconductor device according to an embodiment of the invention. The semiconductor layout 400 includes a metal pad 402, off which a metallic line 404 extends and ends in a small, geometric tip made up of a via 406 that includes a metal island 408, such that the layout 400 is an unbalanced geometric pattern, as has been generally defined in the background. The metallic line 404 is also referred to as an interconnect. The metallic line 404 may be copper. The metallic line 404 and its associated tip constitute a desired semiconductor feature, and there may be more than one such feature. The layout 400 may include in addition to or in lieu of the metallic line 404 and its associated tip the semiconductor layouts of FIGS. 1, 2, and 3 that have been described. That is, the layout 400 may be an unbalanced geometric pattern as has been described. In other words, a semiconductor layout according to an embodiment of the invention may include the semiconductor layouts of FIGS. 1, 2, and 3 that have been described.

Furthermore, the layout 400 includes a sacrificial semiconductor feature made up of a via 410 that includes a metal island 412, which may be referred to more generally as a tip. The metal island 412 maybe optional, however, such that the sacrificial semiconductor feature is instead made up of only the via 410. The sacrificial semiconductor feature extends from the metal pad 402, which may be considered another type of metallic line or interconnect, as may be appreciated by those of ordinary skill within the art. There may be more than one sacrificial semiconductor feature, each having vias that may or may not have corresponding metal islands. It may be said that the sacrificial semiconductor feature as shown in FIG. 4 is needle and/or antenna shaped. It may be needle shaped in that the via 410 appears as a needle off the pad 402, whereas it may be antenna shaped in that, as will be described, charge induced during CMP is attracted by the feature.

The presence of the sacrificial semiconductor feature substantially prevents corrosion of the desired semiconductor feature during chemical-mechanical planarization (CMP) that would otherwise result, as have been described in the background section. That is, the desired semiconductor feature remains substantially uncorroded during CMP. This is because the charge induced during CMP that would otherwise congregate at the tip of the desired semiconductor feature instead congregates at the tip of the sacrificial semiconductor feature. Thus, instead of the desired semiconductor feature corroding during CMP, the sacrificial semiconductor feature corrodes during CMP, and therefore is sacrificed for the desired semiconductor feature.

Figure 6:
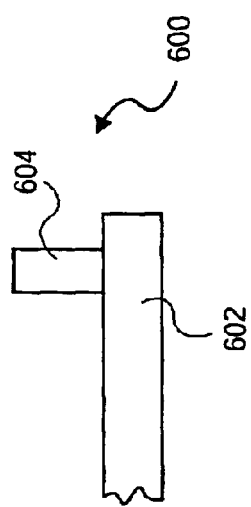
FIG. 6 is a diagram of a side profile of another sacrificial semiconductor feature that includes a via, according to an embodiment of the invention, and that, like the feature of FIG. 5, prevents corrosion of a desired semiconductor feature during performance of CMP by being corroded itself.
Figure 5:
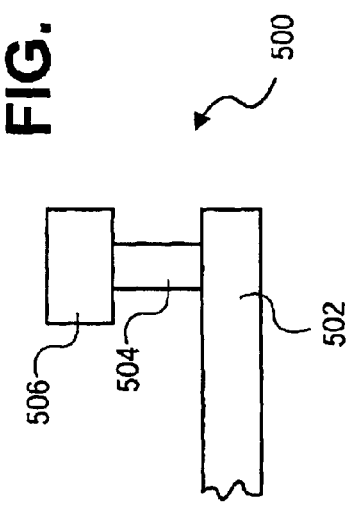
FIG. 5 is a diagram of a side profile of a sacrificial semiconductor feature that includes a stacked via and metal island, according to an embodiment of the invention, and that can be especially used during a dual-damascene process.

FIGS. 5 and 6 are side profiles of different sacrificial semiconductor features according to varying embodiments of the invention. In FIG. 5, the sacrificial semiconductor feature 500 extends off from a metallic line 502 that may be part of a desired semiconductor feature. The feature 500 includes a via 504 ending in a metal island 506. By comparison, in FIG. 6, the sacrificial semiconductor feature 600 also extends off a metallic line 602 that may be part of a desired semiconductor feature. However, the feature 600 only includes a via 604, and does not include a metal island, as the feature 500 of FIG. 5 does.

Figure 7:
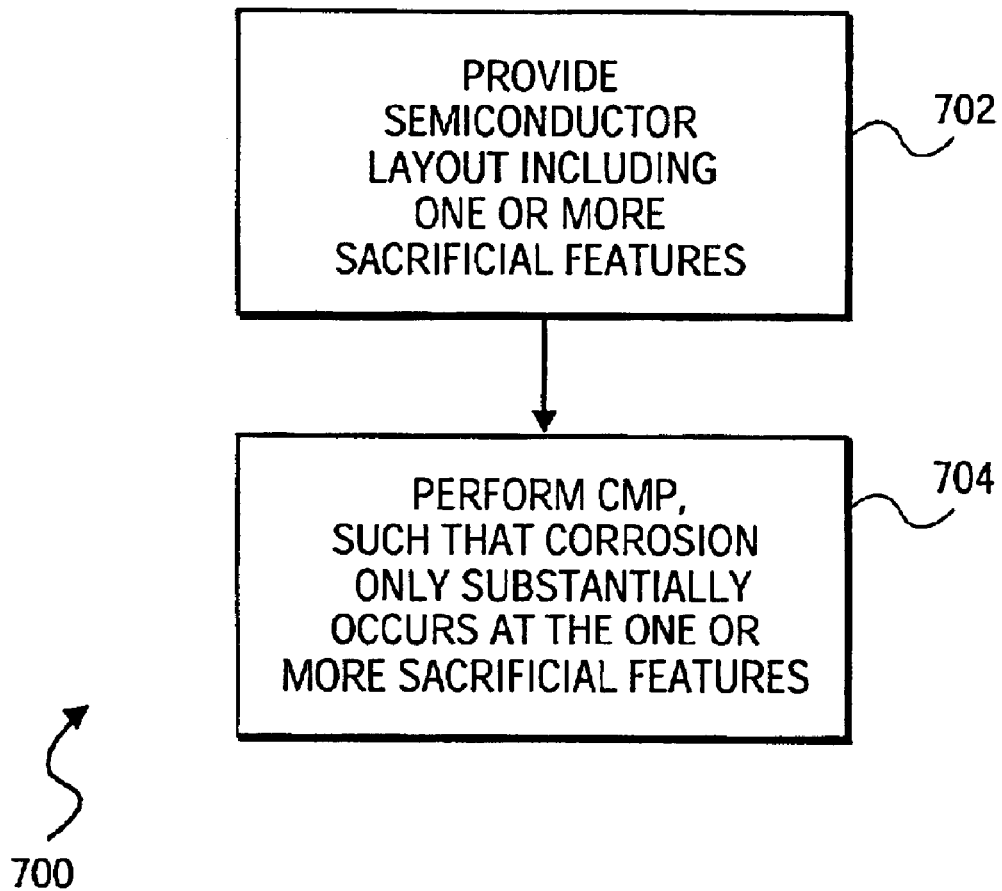
FIG. 7 is a flowchart of a method according to an embodiment of the invention.

FIG. 7 shows a method 700 according to an embodiment of the invention. First, a semiconductor layout is provided that has at least one desired semiconductor features, and one or more sacrificial semiconductor features (702). The desired semiconductor features and the sacrificial semiconductor features may be as has been described, for instance. Next, a semiconductor device is preferably fabricated using the semiconductor layout, including performing CMP (704). The sacrificial semiconductor features act to prevent corrosion of the desired semiconductor features that can result from performing CMP. That is, corrosion only substantially occurs at the sacrificial features, and not at the desired features. This is because the sacrificial features attract charge induced during CMP that would otherwise be attracted by the desired features.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor device comprising:
   at least one desired semiconductor feature fabricated in part by performing chemical-mechanical planarization (CMP), such that the at least one desired semiconductor feature is vulnerable to corrosion resulting from performing the CMP, said at least one desired semiconductor feature comprises a small geometric tip at an end of an interconnect; and,
   at least one sacrificial semiconductor feature corroded during performing the CMP so that the at least one desired semiconductor feature remains substantially uncorroded when the CMP is performed.

2. The device of claim 1, wherein the at least one desired semiconductor feature comprises a metallic interconnect.

3. The device of claim 2, wherein the metallic interconnect is a copper interconnect.

4. The device of claim 1, wherein the small geometric tip comprises a via.

5. The device of claim 1, wherein the at least one desired semiconductor feature has an unbalanced geometric pattern.

6. The device of claim 5, wherein the unbalanced geometric pattern comprises a line ending in at least one tip.

7. The device of claim 6, wherein the at least one sacrificial semiconductor feature comprises one or more tips off the line of the unbalanced geometric pattern.

8. The device of claim 1, wherein the at least one sacrificial semiconductor feature comprises one or more antenna-shaped semiconductor features.

9. The device of claim 1, wherein the at least one sacrificial semiconductor feature comprises one or more vias.

10. The device of claim 1, wherein the at least one sacrificial semiconductor feature comprises one or more vias having corresponding metal islands.

11. The device of claim 1, wherein the at least one sacrificial semiconductor feature attracts charge induced during the CMP that is otherwise attracted by the at least one desired semiconductor feature.

12. A semiconductor device comprising:
    at least one desired semiconductor feature fabricated in part by performing chemical-mechanical planarization (CMP), such that the at least one semiconductor feature is vulnerable to corrosion resultinci from performing the CMP; and,
    at least one sacrificial semiconductor feature corroded during performing the CMP so that the at least one desired semiconductor feature remains substantially uncorroded when the CMP is performed, wherein the at least one sacrificial semiconductor feature comprises one or more needle-shaped semiconductor features.

13. A semiconductor device fabricated at least in part by performing chemical-mechanical planarization (CMP) comprising:
    a desired semiconductor feature having an unbalanced geometric pattern including a metallic line ending in at least one tip, the at least one tip susceptible to corrosion resulting from performing the CMP, said at least one tip comprises at least one via; and,
    a sacrificial semiconductor feature located off the metallic line and attracting charge induced during the CMP that is otherwise attracted by the at least one tip of the desired semiconductor feature, such that presence of the sacrificial semiconductor feature substantially prevents corrosion of the at least one tip.

14. The device of claim 3, wherein the metallic line is a metallic interconnect.

15. The device of claim 13, wherein the sacrificial semiconductor feature comprises one or more vias.

16. The device of claim 13, wherein the sacrificial semiconductor feature comprises one or more vias having corresponding metal islands.

17. A method comprising:
    providing a semiconductor layout having a desired semiconductor feature and a sacrificial semiconductor feature; and,
    fabricating a semiconductor device using the semiconductor layout, including performing chemical-mechanical planarization (CMP), the sacrificial semiconductor feature acting to prevent corrosion of the desired semiconductor feature resulting from performing the CMP, wherein the sacrificial semiconductor feature attracts charge induced during the CMP that is otherwise attracted by the desired semiconductor feature.

* * * * *